United States Patent
Kim

(12) 
(10) Patent No.: US 6,574,524 B2
(45) Date of Patent: Jun. 3, 2003

(54) METHOD OF ALIGNING DIES OF WAFER(S) WITH EXPOSURE EQUIPMENT IN THE FABRICATING OF SEMICONDUCTOR DEVICES

(75) Inventor: Soo-Hyoung Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 266 days.

(21) Appl. No.: 09/800,893

(22) Filed: Mar. 8, 2001

(65) Prior Publication Data
US 2002/0016646 A1 Feb. 7, 2002

(30) Foreign Application Priority Data
Aug. 7, 2000 (KR) .......................................... 00-45600

(51) Int. Cl.[7] ............................................... G06F 19/00
(52) U.S. Cl. ..................................... 700/121; 356/401
(58) Field of Search ........................... 700/121; 356/401

(56) References Cited

U.S. PATENT DOCUMENTS

| | | | | |
|---|---|---|---|---|
| 5,153,678 A | * | 10/1992 | Ota ............................ | 356/401 |
| 5,455,679 A | * | 10/1995 | Houryu et al. .............. | 356/401 |
| 5,543,921 A | * | 8/1996 | Uzawa et al. ............... | 356/401 |
| 5,894,350 A | * | 4/1999 | Hsieh et al. ................. | 356/399 |
| 6,233,494 B1 | * | 5/2001 | Aoyagi ....................... | 700/121 |
| 6,333,786 B1 | * | 12/2001 | Uzawa et al. ............... | 356/401 |

* cited by examiner

*Primary Examiner*—Leo Picard
*Assistant Examiner*—Alexander Kosowski
(74) *Attorney, Agent, or Firm*—Volentine Francos, PLLC

(57) ABSTRACT

A method of exposing the dies of a wafer using the technique of photolithography corrects the deviations that would otherwise occur between the states of alignment of the dies and photolithography exposure equipment. An initial state of alignment of each of the dies of a sample wafer and an exposure device is inspected. The inspection is used to generate raw data of any deviation between the initial states of alignment and ideal states of alignment. The raw data is mapped, and stored as processed data. Both the processed data and basic data concerning the sample wafer are used to produce a preliminary job file that establishes the basic setting of the exposure equipment. Also, a correction deviation value is generated for each of the dies of the sample wafer except for those dies that will be positioned at the ideal position of alignment under the basic setting of the exposure device. The preliminary job file is changed on the basis of the correction deviation values to thereby form a final job file. Then, each of the dies of the sample wafer are exposed under the direction of the final job file.

9 Claims, 3 Drawing Sheets

METHOD OF ALIGNING DIES OF WAFER(S) WITH EXPOSURE EQUIPMENT IN THE FABRICATING OF SEMICONDUCTOR DEVICES

BACKGROUND OF THE INVENTION

1. Field of the Invention

The present invention relates to the photolithography process used in fabricating semiconductor devices. More particularly, the present invention relates to a method of aligning the dies of a wafer in succession with a photomask of photolithography equipment in the process of exposing the dies to an image borne by the photomask.

2. Description of the Related Art

The fabricating of a highly integrated semiconductor device requires forming a plurality of wiring patterns within a small area. The extent to which a large number of wiring patterns can be formed within a given area depends upon available photolithography exposure techniques more than anything else. In photolithography, respective areas of a wafer are exposed in succession to a predetermined pattern. Subsequently, the exposed areas are developed whereupon the wafer is patterned.

The precision of the exposure process must be increased if the current demand for more highly integrated and for higher quality semiconductor devices is to be met. In order to improve the precision of the exposure process, the capability of the exposure equipment to perform a self-analysis of the exposure process and the precision under which the wafer and the exposure equipment are aligned relative to one another must both be improved. In particular, currently available photolithography equipment has an analysis capability that is insufficient for determining whether the exposure process has yielded a semiconductor product of a quality meeting current requirements. Even the use of deep ultraviolet rays (DUV) to enhance the analysis capability of today's photolithography equipment poses certain limitations. Therefore, a self-aligning patterning method and the like are being explored as means to produce a pattern of a desired size at a precise position on a wafer.

More specifically, fabricating a semiconductor device involves forming a three-dimensional wiring pattern on a wafer. To form such a wiring pattern, several layers of material are deposited sequentially on the wafer, and these layers are patterned and/or processed. The patterning of a layer of material on the wafer is carried out through the execution of numerous exposure processes in which a respective pattern is transferred repeatedly onto the layer at several areas thereof, respectively. In this process, a photomask bearing the pattern is aligned with certain areas of the wafer in succession so that the pattern of the photomask is positioned relative to patterns already transferred to or to be transferred to the layer of material on the wafer.

In the alignment process, an alignment key pattern is formed on the wafer. The alignment key pattern is used as a reference mark during the process of aligning the wafer with the photomask. An overlay key pattern, formed on the photomask, is used to inspect the state of alignment between the photomask and a selected area of the wafer. The inspection process determines whether the overlay key pattern coincides with or otherwise corresponds to the alignment key pattern, i.e., whether a pattern to be transferred to an area on the wafer during the current exposure process is positioned precisely relative to the pattern that was transferred to another area on the wafer during the previous exposure process.

Image recognition and analysis equipment such as a KLA is used to quantify (measure) the state of alignment between the alignment key pattern and the overlay key pattern. Specifically, the KLA produces an image alignment deviation value and issues a signal representative of this value to the stepper of the photolithography equipment. The image alignment deviation value is used by the stepper to correct, if necessary, the state of alignment between the photomask and the wafer.

In a conventional alignment method, the state of alignment is inspected and used to position the wafer in the processes of exposing the individual areas of the wafer. That is, the inspection process is carried out in connection with the exposure of each and every die of each and every wafer. Such a method comprising numerous inspecting steps is a hindrance on the production efficiency of the exposure process and becomes particularly onerous when the wafer comprises a large number of dies.

Recently, therefore, an alignment method has been developed in which several sample dies from a wafer are selected, the state of alignment of only these sample dies is inspected, deviation data is produced from the inspecting of the state of alignment of the sample dies, and a final job file is produced from the deviation data. Basically, the final job file dictates an overall alignment corrected position for wafers loaded in the stepper. That is, once a wafer is loaded onto a stage in the stepper, the wafer is moved linearly or is rotated, or the exposure equipment is focused, on the basis of the final job file, to set the wafer at the corrected position. After the wafer is set at the corrected position, the wafer stage is moved in increments determined by the size of the dies, to execute the exposure processes without any further inspecting of the state of alignment of the individual dies.

Such an overall alignment correction method is advantageous in terms of enhancing the efficiency of the exposure process. Furthermore, under this method, the actual aligned positions of the individual dies does not deviate much from the ideal positions because the photolithography equipment, i.e., the stepper, is in general very precise. At present, however, the so-called process margin of the exposure process has become very small in order to meet the strong demand for more highly integrated semiconductor devices. Therefore, even a small deviation per die between the actual and ideal state of alignment becomes problematic.

Such small deviations are shown in FIG. 1. In this figure, the magnitude and direction of alignment errors or deviations are represented by the vectors. As can be appreciated from FIG. 1, under the conventional overall alignment correction method, most of the dies will have a similar or the same deviation. Therefore, under the overall alignment correction method, the same inferior state of alignment is present throughout a significant part of the wafer.

There are several potential causes for the occurrence of such a constant alignment deviation. One of the causes might be merely the increase in size of the wafers that are being processed today. Also, seeing that many different devices make up the exposure equipment used in fabricating a semiconductor device, some characteristic particular to the device(s) can give rise to an alignment deviation which can not be overcome using the conventional overall alignment correction method. For instance, a typical piece of exposure equipment comprises a flat plate having side walls extending along X- and Y-axes, respectively, and a mirror mounted to one of the side walls. The wafer is mounted on the flat plate, whereby the plate serves as a wafer stage. The mirror constitutes an interferometer that is used to determine the distances between the side walls of the plate and reference positions as measured along the X-and Y-axes, respectively. These distances are used to precisely position the flat plate, on which the wafer is mounted, during the exposure process. However, the mirror is generally not exactly planar, and so the origin of light reflecting from the mirror can not always be exactly determined. Thus, a measurement value obtained by the interferometer to represent the distance along the X-axis between the flat plate and a reference position might not be accurate. In this case, the flat plate might deviate from its desired position when it is moved along the Y-axis as fixed in the direction of the X-axis on the basis of the measurement value produced by the interferometer.

Of course, such a deviation inherent in the exposure equipment could be compensated for to some extent by reflecting its value in an operative program of the equipment. For instance, in the example of an interferometer described above, the interferometer is first calibrated (referred to as a grid calibration) at each of several constant intervals of movement of the flat plate to determine its deviation with respect to an operation employing an ideal (planar) reflective surface. The value of the deviation is then input as basic data to a higher level operative program of the exposure equipment. Consequently, the movement of the flat plate over the predetermined intervals during the exposure processes is supplemented with additional movement in a direction determined based on the deviation value. That is, the operation of the equipment is modified to take into account the inherent characteristics of the equipment that would otherwise affect the precision of the alignment method.

However, in this control method, the deviation values-are not based on measurements at all virtual grid points in the plane of the X- and Y-axes. Rather, the deviation values are obtained, respectively, at every unit length along the X-axis and at every unit length along the Y-axis. These deviation values are referenced to corresponding positions spaced from one another by the unit lengths in the directions of the X- and Y-axes. Therefore, this control method does not take into account all the possible deviations that can occur in the alignment method.

Moreover, the flat plate, i.e., the wafer stage, can not be moved exactly parallel to the X- and Y-axes due to limitations in the mechanical precision under which the flat plate can be guided by guide members. Thus, even if the deviation caused by the reflecting surface of the mirror of the interferometer is a known constant, this deviation might not manifest itself equally at all positions of the wafer stage. In other words, any deviation is not only dependent on the planarity of the reflecting surface of the mirror of the interferometer but also on the position to which the wafer stage has been guided. Thus, the magnitude and direction of the deviation determined from the grid calibration can change during operation.

Considering that a wafer is subjected to tens of the exposure processes in order to fabricate a semiconductor device on the wafer, that the exposure equipment is made up of several different devices, and that each of the devices has its own deviation characteristic, it is difficult to compensate for the deviation per die using the overall alignment correction method. Furthermore, the alignment deviation per die due to inherent characteristics of the device(s) of the exposure equipment becomes more problematic the smaller the process margin becomes. Meanwhile, the other conventional method of inspecting the state of alignment of each of the dies for each and every wafer and correcting the deviations when revealed by the inspecting steps is simply impractical in terms of production efficiency.

SUMMARY OF THE INVENTION

Accordingly, an object of the present invention is to provide a method of aligning the dies of wafers with an exposure device, that substantially obviates one or more of the above-described limitations and disadvantages of the prior art.

More specifically, an object of the present invention is to provide an alignment method which compensates for not only the overall alignment deviation that is uniform with respect to several dies of the wafer but also compensates for the alignment deviations that differ from the overall alignment deviation and are unique to the other dies of the wafer.

To achieve this object, the present invention provides a method in which a given number of wafers to be processed is designated as a basic lot unit, and for every basic lot unit, one of the wafers to be processed is selected. Then, states of alignment between all of the dies of the selected wafer and the exposure device are inspected. The results of the inspections are used to produce alignment deviation data, and the data is mapped to produce a map of the respective deviations of the dies from ideal positions, i.e. the positions at which they would be ideally aligned with an exposure device. Such alignment deviation data for each die is transferred to a stepper together with basic data about the wafer, namely, data of the intervals at which the wafer must be moved between exposure processes as dictated by the size and spacing of the dies, etc.

The alignment deviation data can be transferred to the stepper via magnetic diskette, an on-line transmission or the like. The alignment deviation data may be transferred as raw data devoid of concrete variables for programming or may be converted into data capable of being input to an operative program stored in the stepper. That is, before being transferred to the stepper, the raw data can be converted into processed data, capable of being read by the stepper, by image analysis equipment or a specific mapping tool that is auxiliary to the stepper.

In any case, consequently, the stepper produces a preliminary job file from the alignment deviation data, and from basic data about the wafer. The basic data will include the distances between the dies of the wafer as well as the planned sequence in which the dies are to be successively brought into alignment with the exposure device during the exposure process.

If the alignment deviation data was raw data that was transmitted to the stepper, the stepper converts the raw data into the data making up the preliminary job file. On the other hand, if the alignment deviation data had been transmitted to the stepper as data converted into programming language by an auxiliary piece of equipment, the stepper produces its preliminary job file from the programming language. At this time, the preliminary job file establishes the basic setting of the stepper. More specifically, the preliminary job file establishes for the stepper the initial exposure position of the wafer stage in the X- and Y-directions, the depth of focus or magnification to be used in the exposure process, and an increment of angular rotation necessary to correct a deviation of the wafer stage from an ideal angular orientation. In other words, the preliminary job file causes the stepper to execute an overall alignment correction method.

Next, alignment correction data is generated for compensating for the deviation of each die of the wafer. The correction data may be produced by calculating correction values and then deducting these correction values, respectively, from original alignment deviation data values determined by the inspecting of the individual dies of the selected wafer.

The correction data for each die so obtained is inputted into the preliminary job file by a feed-back system. The preliminary job file is thereby modified by the correction data to produce a final job file. The modification of the preliminary job file generally involves using the correction data to change, if necessary, the die-to-die distances that were input to the stepper as part of the basic data of the wafer (the exception being the die-to-die distances between dies at the ends of adjacent rows of the dies-the reason for this will be evident from the detailed description). Thus, according to the final job file, the basic wafer data of the die-to-die distances is adjusted to reflect the correction data so that the wafer stage will be moved in increments effecting a fine control in the positioning, i.e., aligning, of the dies relative to the exposure device. Thus, the increments over which the wafer stage might be moved between successive processes of exposing the dies may be rather different.

Once the final job file is so configured, the stepper moves the dies in succession into alignment with the exposure device, under the control of the final job file, whereupon the dies of the selected wafer are successively exposed to the image of the photomask.

In addition, another object of the present invention is to provide a method, in the mass-production of semiconductor devices, of exposing the dies of a plurality of wafers using photolithography and which method can effect a correction of alignment deviations to a great extent without seriously compromising the efficiency of the process.

Thus, in addition to the steps described above, the method of the present invention also includes steps of sampling the states of alignment between the next wafer(s) of the lot and the exposure device, and of providing a respective preliminary job file and a respective final job file for the next wafer(s) of the lot. If a statistical analysis reveals corresponding deviations between the selected wafer and the next wafer(s) of the lot, the same correction deviation values are used to provide the final job file. Otherwise, new correction deviation values are produced.

That is, alignment deviations may differ among even wafers within a lot processed by the same equipment and under the same conditions. Therefore, the initial state of alignment between only some (several) dies of the next wafer of the lot and the exposure device are inspected. Then, the basic setting of the stepper is established as the result of the inspections. In other words, the preliminary job file is generated independently of that generated for the previous wafer of the lot. However, should an analysis of the states of alignment reveal the same deviations between corresponding dies of the wafers in the lot, then the correction deviation data associated with the corresponding dies is appropriately transferred to the final job file.

In particular, when the method of the present invention is to be practiced, a technician will generally decide the number of wafers that are to make up the lot according to the current state of the manufacturing line and process being carried out thereby. A lot is established on the premise that the wafers having undergone the same processes (type and condition) prior to the exposure process will tend to produce the same alignment deviations. That is, if a die of a wafer of the lot shows an alignment deviation, the corresponding dies of the other wafers of the lot should show the same alignment deviation. The inspecting of the states of alignment of only a sample of the dies of the wafer(s) merely confirms the results of the inspecting of the states of alignment of all of the dies of the sample (first) wafer of the lot.

In addition, the number of wafers that are to constitute a lot can be changed during the course of the overall manufacturing process. For example, the manufacturing process may develop some serious flaw and results may show that deviations in the alignment states are not being sufficiently corrected. In such a case, a mode of operation of the present invention can be changed. That is, the number of wafers constituting a lot can be reduced mid-operation. Conversely, should the results show a strong trend toward uniform alignment state deviations, the number of wafers constituting a lot can be increased mid-operation.

BRIEF DESCRIPTION OF THE ATTACHED DRAWINGS

These and other objects, features and advantages of the present invention will become more apparent from the following detailed description of the preferred embodiments thereof made with reference tot he attached drawings.

DETAILED DESCRIPTION OF THE PREFERRED EMBODIMENTS

Reference will now be made in detail to the preferred embodiments of the present invention, an example of which is illustrated in the accompanying drawings.

Figure 1:
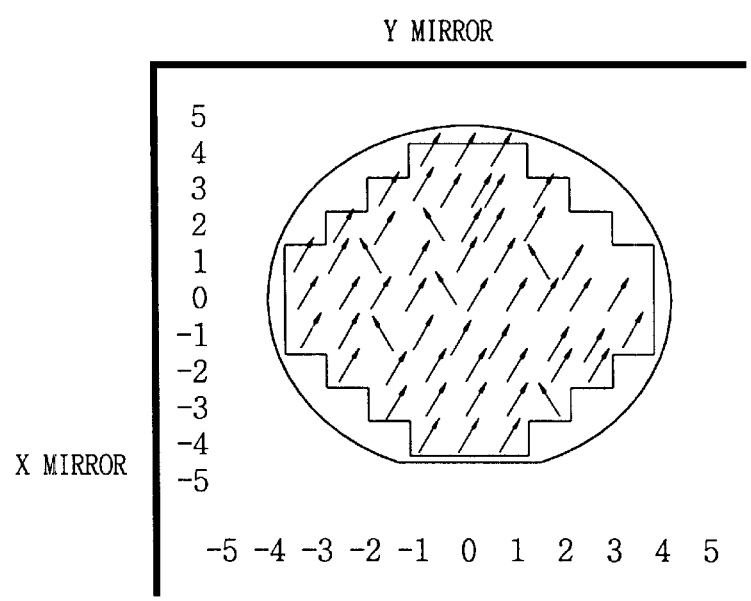
FIG. 1 is a concept diagram showing, as vectors, deviations in the states of alignment of dies of a wafer with an exposure device of photolithography equipment, when a conventional overall alignment correction method is performed.
Figure 2:
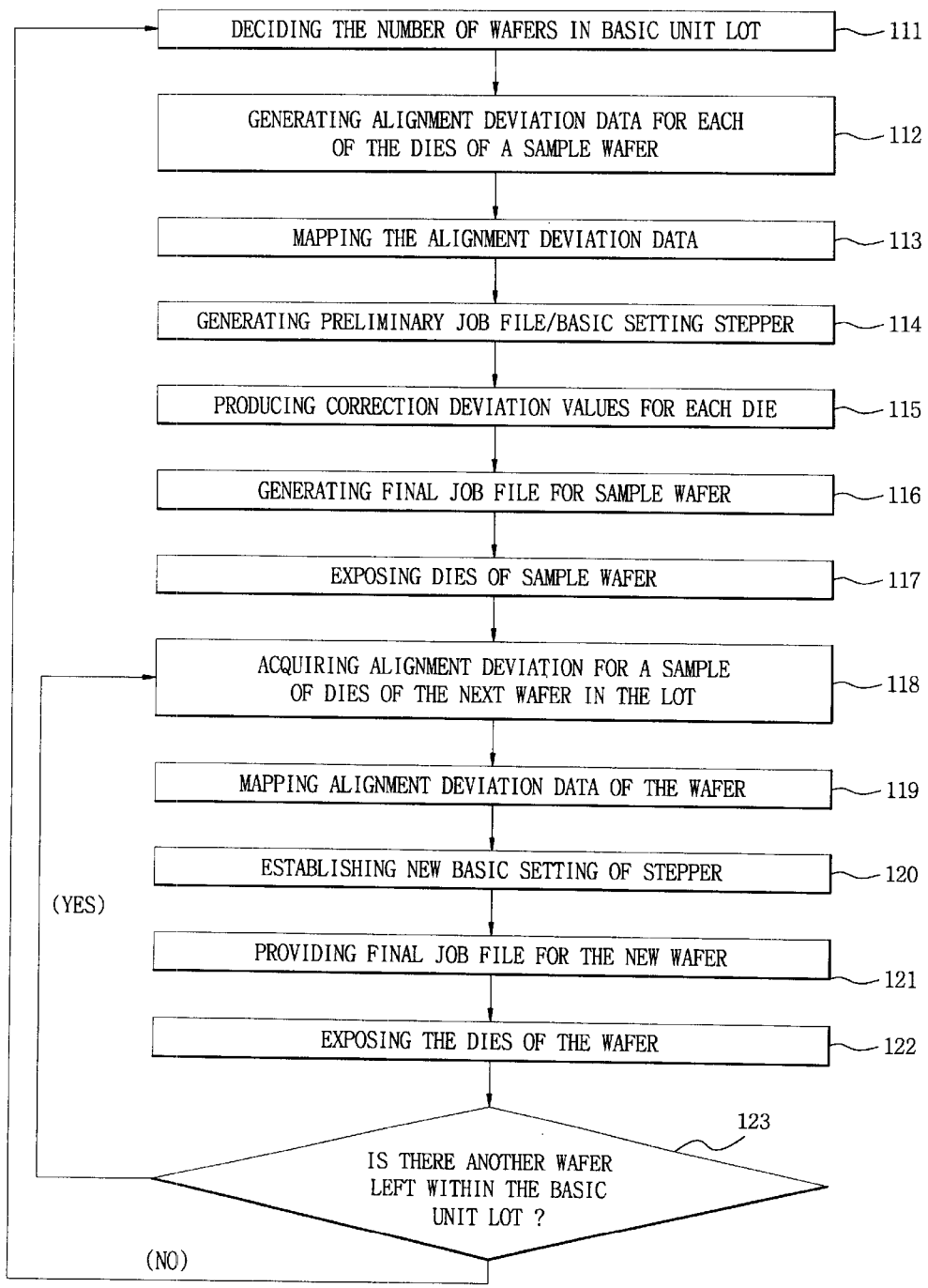
FIG. 2 is a flow chart of the preferred embodiment of a method of aligning a wafer with an exposure device according to the present invention.

FIG. 2 is a flow chart of a method of aligning the dies of a wafer in exposure equipment according to the present invention. However, as a preliminary matter, it should be determined during the fabrication process as to whether the exposure process can be carried out satisfactorily by merely using the conventional overall alignment correction method or whether the more precise method offered by the present invention is necessary. In other words, assuming that the ongoing method of manufacture is not producing wafers having dies experiencing local or unique alignment deviations, a mode in which the present invention is not employed, i.e., the overall alignment correction method, can be selected. The following description, however, pertains to the mode in which the method of the present invention has been selected.

The first step 111 of the present invention comprises deciding the number of wafers that are to make up a basic unit lot. In general, the number of wafers selected as constituting the basic unit lot is 25.

In the second step 112, alignment deviation data per die is generated for all dies on a sample wafer selected from the basic unit lot.

More specifically, a basic unit lot of wafers is sent to an exposure system. The exposure system includes an image analyzer (KLA) and an exposure device (stepper). The KLA inspects the state of alignment between all of the dies of a first (sample) wafer of the basic unit lot and the stepper. The results of the inspection are quantified as alignment deviation values for each die, and the alignment deviation values are stored. A magnetic diskette or an internal memory device can be used as the medium for storing the alignment deviation data.

The third step 113 comprises mapping the alignment deviation data. In this step, the raw data constituting the alignment deviation data is also processed to produce data of a type that can be used by the stepper in establishing the basic setting thereof. The raw data may be processed in the image analyzer, a processor of the stepper or an auxiliary processor. In any case, the processed data is transferred to an input of the stepper.

Figure 3:
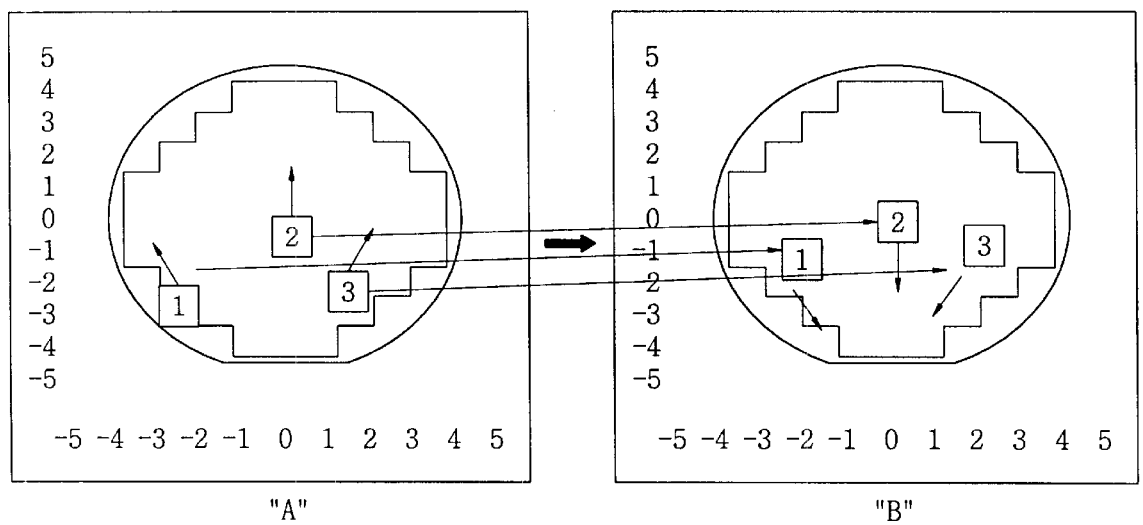
FIG. 3 is a concept diagram of a mapping process employed by the present invention.

FIG. 3 shows a simple example of the data mapping. Map "A" in the drawing depicts, as vectors, the deviations of the states of alignment of the dies of the sample wafer as determined by the inspecting of each of the states of alignment using the KLA. The magnitude and direction of each vector corresponds to the magnitude and direction of the alignment deviation of a respective die. That is, each vector represents how much and in which direction the position of the die deviates from a position of alignment ideal for the exposure process. For the sake of convenience, the mapping of the alignment deviation data for only three of the respective dies, designated by reference numerals 1, 2 and 3, respectively, is shown. As an example, for the die designated by reference numeral 1, the alignment deviation is −30 (of a basic unit of distance) in the direction of the X-axis and 40 (of the basic unit of distance) in the direction of the Y-axis.

Note, in connection with step 113, data generated by the image analyzer, and used to make or correct a job file for controlling the stepper, can be mapped according to a method represented by the arrow shown in FIG. 3 (although any appropriate data mapping method can be used). In the method shown in FIG. 3, vectors inverse to those representing the alignment deviations of the dies of the wafer are mapped. These inverse vectors, therefore, represent the magnitudes and directions of movement of the wafer necessary to place the dies in their ideal alignment positions for exposure.

In a fourth step 114, a preliminary job file defining the parameters of an overall alignment correction is generated. Thus, the preliminary job file is used to establish the basic setting of the stepper.

In the preferred embodiment, the preliminary job file is made up of roughly two kinds of control programs. The first of these control programs is a configurable program used to control the movement of the wafer stage during the processes of exposing the dies of the wafer. Hence, one variable of this configurable program is the interval at which the dies are spaced apart from one another. Basic data characterizing the wafer, including a representation of the interval at which the dies of the wafer are spaced from one another, is input into the first program. However, note, the basic data can be input at any time prior to the start of the actual exposure process. In addition, the sequence along which the exposure process is to proceed from die to die is also input into the first program. For example, in a typical sequence, the wafer stage on which a wafer is mounted is moved linearly from left to right so that the dies along one row are sequentially exposed. Once the last die in the row is exposed, the wafer stage is shifted orthogonally to the direction of the left to right movement to bring a die at the end of the adjacent row into position. Then, the wafer stage is moved from right to left, and so on. The planned sequence is confirmed from the basic data of the wafer.

The second one of the control programs concerns the correction for the deviation in the states of alignment of the dies of the selected wafer based on the inspecting of the alignment states of the dies of the sample wafer. The correction adjusts parameters of the exposure process such as the magnification of the exposure process, depth of focus, relative linear movement of the wafer stage and angular orientation of the wafer stage.

In a fifth step 115 of the present invention, an alignment deviation improvement value is calculated for each die, from the data generated by the inspecting the alignment states of the dies. The alignment deviation improvement values are deducted from the alignment deviation values generated in step 112, whereby correction deviation data for each die is produced. The correction deviation data is memorized at a dedicated storage location.

In a sixth step 116, a final job file is generated to produce the parameters under which the stepper will be operated when the dies of the sample wafer are exposed. The generating of the final job file serves to prevent any die of the sample wafer from experiencing a deviation in its state of alignment during the exposure process, in particular those which would otherwise experience a unique or local deviation in their state of alignment and hence, would not have their alignment deviation corrected under the parameters (overall correction and sequence of operation) of the preliminary job file. In this step, the correction deviation data for each die is inputted to the stepper.

In this operation, according to the preferred embodiment of the invention, the second control program used in establishing the basic setting of the stepper is not changed. Rather, the first control program of the preliminary job file is reconfigured so that the planned movement of the wafer stage is finely adjusted. That is, the planned increments by which the stage was to be moved along the X-and Y-axes, i.e., the planned die to die movement, are corrected to compensate for the alignment deviation for each die. Therefore, new parameters corresponding to the number of dies are input to the first control program. The final job file thus comprises the first control program as reconfigured and the original second control program.

In a seventh step 117, the dies of the sample (first) wafer are exposed under the direction of the final job file. In this step, the second control program dictates the basic setting of the stepper, but does not confer any control on the mechanical operation by which the dies are moved before and after the exposure process. Rather, the wafer stage is moved over increments specific to each die, for establishing a corrected position of the die relative to the exposure equipment, under the direction of the reconfigured first control program.

For example, if an alignment deviation for a die is predicted as a result of the inspection of the wafer, the die is moved by a distance equal in magnitude but opposite in direction to the alignment deviation just before the die is to be exposed, whereby the deviation is offset. Thus, in the case of the die designated by reference numeral 1 in FIG. 3, the alignment correction data value reflected in the final job file is 30 along the direction of the X-axis and −40 along the direction of the Y-axis. Therefore, when the die 1 is being readied for its exposure, the stage is moved by 30 in the direction of the X-axis and by −40 in the direction of the Y-axis, in addition to the die-to-die distance between the previously exposed die and die 1.

In an eighth step 118, the next wafer within the basic unit lot is inspected by the image analyzer. At this time, unlike with the first wafer, the alignment states of only some (a sample) of the dies are inspected. The sampling is determined on the basis of an analysis of the data produced as the result of the inspecting of the sample wafer. The aim of the sampling is to confirm the validity of the last final job file produced for the current wafer that is being readied for exposure.

In a ninth step 119, similarly to step 113, the alignment data obtained through the inspecting of the sample of dies of the wafer is mapped.

The tenth step 120 is similar to the fourth step 114. In step 120, a preliminary job file dedicated to the wafer is produced, and the basic setting of the stepper for the process of exposing the next wafer is established.

The eleventh step 121 is similar to the sixth step 116. That is, correction deviation data is used to produce the final job file for the wafer. If the sampling indicates that the current wafer has essentially the same deviations for each die as the previous wafer, then the final job file for the previous wafer can be used. On the other hand, if the sampling reveals that there are some deviations that are different from those of the corresponding dies of the previous wafer, then a refined final job file is produced.

In the twelfth step 122, the dies of the wafer are exposed according to the final job file.

According to a thirteenth step 123, the steps from the eighth step 118 to the twelfth step 122 are repeated until all of the wafers within the basic unit lot are exposed. Subsequently, the operation returns to step 111 to start the exposure process for a new lot of wafers. The correction deviation data associated with the previous lot is replaced by new correction deviation data produced by inspecting all of the dies of a first wafer of the new lot.

As is evident from the detailed description above, the present invention provides a method by which all alignment deviations between the dies of a wafer and exposure equipment are corrected. The present invention also provides a method by which alignment deviations between the dies of all of the wafers in a lot thereof and exposure equipment are minimized without the time-consuming need for inspecting all of the alignment states. Accordingly, the present invention reduces manufacturing defects in semiconductor devices associated with alignment deviations during the exposure process, without seriously compromising the efficiency of the process of manufacturing the semiconductor devices in mass.

Finally, various changes to and modifications of the present invention will become apparent to those of ordinary skill in the art. Thus, all such changes and modifications are seen to be within the true spirit and scope of the invention as defined by the appended claims.

What is claimed is:

1. A method of exposing the dies of a wafer using photolithography, said method comprising steps of:

positioning a sample wafer on a wafer stage operatively associated with an exposure device of photolithography equipment;

moving the stage with the sample wafer thereon by predetermined increments, based on known characteristics of the dies of the sample wafer, to move each of the dies of the sample wafer sequentially to an initial aligned position relative to the exposure device;

inspecting the sample wafer for any deviation between the initial aligned position and an ideal position of alignment for each of the dies of the sample wafer, and generating raw data representative of said deviation for each die of the sample wafer;

mapping the raw data to correlate the deviations to the areas on the sample wafer where the deviations occur, and storing the mapped data as processed data;

forming a preliminary job file on the basis of at least the processed data, and using the preliminary job file to establish a basic setting of the exposure device that defines initial operating parameters of the exposure device, and which parameters cause the exposure device to perform an overall alignment correction operation in which an initial alignment of the sample wafer relative to the exposure device is set prior to the exposure of the dies;

from the stored data, generating a correction deviation value for each of the dies of the sample wafer except for those dies that will be positioned at the ideal position of alignment under the basic setting of the exposure device established by the preliminary job file;

on the basis of the correction deviation values for the dies, forming a final job file by which the exposure equipment will operate after the basic setting of the exposure device is established; and sequentially moving the dies of the sample wafer to an exposure position at which the dies are aligned relative to the exposure device, and exposing each of the dies to an image borne by the exposure device once the die is at the exposure position, all under the direction of the final job file, whereby said deviation is minimized for each of the dies.

2. The method of claim 1, wherein said generating of raw data comprises producing data representing first vectors each of whose magnitude and direction corresponds to a said deviation, and said processing of the raw data comprises producing data representing second vectors equal in magnitude and opposite in direction to said first vectors, respectively.

3. The method of claim 1, and further comprising inputting basic data of the sample wafer that includes respective distances between adjacent ones of the dies of the sample wafer, and wherein said forming of the preliminary job file comprises storing the basic data of the sample wafer, and wherein said forming of the final job file comprises using the correction deviation values to change the stored basic data that represents the distances between the dies of the sample wafer.

4. The method of claim 1, wherein the initial operating parameters of the exposure device establish increments by which the wafer stage will be moved between successive exposure processes, the initial angular orientation of the wafer stage, and the magnification under which the dies are to be exposed to said image.

5. The method of claim 1, and further comprising inputting basic data of the sample wafer that includes respective distances between adjacent ones of the dies of the sample wafer, and storing the basic data along with said processed data.

6. A method in the mass production of semiconductor devices of exposing the dies of a plurality of wafers using photolithography, said method comprising steps of:

(a) determining a number of wafers that are to constitute a basic unit lot;

(b) positioning a sample wafer from a said lot on a wafer stage operatively associated with an exposure device of photolithography equipment;

(c) moving the stage with the sample wafer thereon by predetermined increments, based on known characteristics of the dies of the sample wafer, to move the dies sequentially to an initial aligned position relative to the exposure device;

(d) inspecting the sample wafer for any deviation between the initial aligned position and an ideal position of alignment for each of the dies of the sample wafer, and generating raw data representative of said deviation for each die of the sample wafer;

(e) mapping the raw data to correlate the deviations to the areas on the sample wafer where the deviations occur, and storing the mapped data as processed data;

(f) forming a preliminary job file on the basis of at least the processed data, and using the preliminary job file to establish a basic setting of the exposure device that defines initial operating parameters of the exposure device, and which parameters cause the exposure device to perform an overall alignment correction operation in which an initial alignment of the sample wafer relative to the exposure device is set prior to the exposure of the dies;

(g) from the stored data, generating a correction deviation value for each of the dies of the sample wafer except for those dies that will be positioned at the ideal position of alignment under the basic setting of the exposure device established by the preliminary job file;

(h) on the basis of the correction deviation values for the dies, forming a final job file by which the exposure device will operate after the basic setting of the exposure equipment is established;

(i) sequentially moving the dies of the sample wafer to an exposure position at which the dies are aligned relative to the exposure device, and exposing each of the dies to an image borne by the exposure device once the die is at the exposure position, all under the direction of the final job file;

(j) mounting the next wafer of the basic unit lot onto the wafer stage;

(k) moving the stage with the next wafer thereon by predetermined increments, based on known characteristics of the dies of said next wafer, to move only some of the dies of said next wafer sequentially to an initial aligned position relative to the exposure device;

(l) inspecting said next wafer for any deviation between the initial aligned position and an ideal position of alignment for only said some of the dies of the wafer, generating raw data representative of any such deviation, and processing said raw data representative of any such deviation;

(m) providing a preliminary job file for said next wafer, and using the preliminary job file provided for said next wafer to establish a basic setting of the exposure device that defines operating parameters of the exposure device, dedicated to said next wafer and which parameters cause the exposure device to perform an overall alignment correction operation in which an initial alignment of said next wafer relative to the exposure device is set prior to the exposure of the dies of said next wafer;

(n) forming a final job file, reflecting results of said step (l), dedicated to said next wafer and by which final job file the exposure device will operate after the basic setting of the exposure equipment dedicated to said next wafer is established;

(o) sequentially moving each of the dies of said next wafer to an exposure position at which each of the dies is aligned relative to the exposure device, and exposing each of the dies of said next wafer to the image borne by the exposure device once the die is at the exposure position, all under the direction of the final job file dedicated to said next wafer; and (p) repeating steps (j) through (o).

7. The method of claim 6, wherein the processing of the raw data in step (l) is carried out to determine the dies of said next wafer that have deviations substantially the same as the deviations of corresponding dies of said sample wafer, and said step of providing the final job file dedicated to said next wafer comprises incorporating into the final job file selected correction deviation values generated in step (g) for all of the dies of said next wafer determined to have said substantially the same deviations as the corresponding dies of the sample wafer.

8. The method of claim 6, wherein step (a) is carried out before steps (b) through (p) are executed.

9. The method of claim 8, wherein step (a) comprises selecting 25 wafers as the number of wafers constituting each said basic unit lot.

* * * * *